(12) United States Patent
Ferguson (10) Patent No.: US 8,366,946 B2
(45) Date of Patent: Feb. 5, 2013

(54) FRAME FOR HOLDING LAMINATE DURING PROCESSING

(75) Inventor: Jason Douglas Ferguson, Bloomfield, IN (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 748 days.

(21) Appl. No.: 12/550,289

(22) Filed: Aug. 28, 2009

(65) Prior Publication Data
US 2011/0049087 A1 Mar. 3, 2011

(51) Int. Cl.
*H01B 13/00* (2006.01)

(52) U.S. Cl. ............ 216/13; 118/30; 118/301; 118/309; 118/314; 206/454; 206/706; 206/720; 206/713; 206/714

(58) Field of Classification Search ..... 269/8; 29/25.01; 29/832; 335/283; 361/679.31; 369/13.01; 379/207.02; 414/416.07; 428/216, 425.9, 428/76, 827, 835.2; 430/311
See application file for complete search history.

(56) References Cited

U.S. PATENT DOCUMENTS

| | | | |
|---|---|---|---|
| 4,302,268 A * | 11/1981 | Tachiki et al. ................ | 156/238 |
| 4,819,041 A | 4/1989 | Redmond | |
| 4,837,123 A | 6/1989 | Kato et al. | |
| 4,892,295 A | 1/1990 | Keller | |
| 5,047,629 A * | 9/1991 | Geist .......................... | 250/231.1 |
| 5,115,905 A | 5/1992 | Hollinger, II | |
| 5,147,828 A | 9/1992 | Ebbing et al. | |
| 5,462,784 A * | 10/1995 | Grill et al. .................. | 428/835.2 |
| 5,588,996 A * | 12/1996 | Costello ....................... | 118/668 |
| 5,609,102 A | 3/1997 | Rapp | |
| 5,730,162 A * | 3/1998 | Shindo et al. .................. | 134/66 |
| 5,795,405 A * | 8/1998 | Harnden et al. ............. | 134/25.4 |
| 6,667,090 B2 | 12/2003 | Boggs et al. | |
| 6,820,553 B2 | 11/2004 | Steffen et al. | |
| 2002/0084208 A1 * | 7/2002 | Charais ......................... | 206/706 |
| 2003/0180495 A1 | 9/2003 | Ito et al. | |
| 2004/0238370 A1 * | 12/2004 | Watanabe et al. ............ | 205/125 |
| 2009/0159324 A1 | 6/2009 | Happoya et al. | |

FOREIGN PATENT DOCUMENTS

JP 2004-090107 * 3/2004

OTHER PUBLICATIONS

Machine translation of JP2004-090107 pulled Apr. 25, 2012.*

* cited by examiner

*Primary Examiner* — Duy Deo
*Assistant Examiner* — Erin Bergner
(74) *Attorney, Agent, or Firm* — Christopher A. Monsey (57) ABSTRACT

A rigid holder is provided for supporting a flexible article. The rigid holder may include a first frame member and a second frame member which are held together through magnets.

25 Claims, 10 Drawing Sheets

FRAME FOR HOLDING LAMINATE DURING PROCESSING

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon.

BACKGROUND OF THE INVENTION

The present invention relates generally to devices for transporting a flexible article, and, more particularly, to devices for transporting a thin laminate through one or more processing stations.

Figure 1:
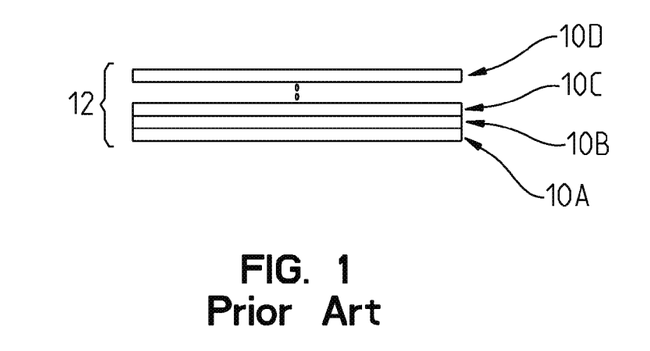
FIG. 1 is a representative view of a printed circuit board formed from a plurality of thin laminates.

Flexible articles often need to be held generally flat for various processing operations. An exemplary flexible article is a thin laminate which is processed to be part of a printed circuit board. Referring to FIG. 1, a plurality of thin laminates 10A-D are shown. These laminates 10 are stacked and coupled together to form a printed circuit board 12. In some circuit boards 12 between 10 and 20 laminates 10 are stacked together to form the circuit board 12. As is known, each of laminates 10 may be processed to provide electrical connections and components on the laminate 10. Further, the electrical connections for a given laminate may be connected to the electrical connections of other laminates 10 in the final printed circuit board 12.

Printed Circuit Board (PCB) fabrication involves a sequence of process steps that are performed on the thin laminates 10. The type and number of steps depends on the complexity of the PCB being fabricated, however, most if not all multilayer PCB boards will require a photolithography operation and an surface treatment operation.

Photolithography involves coating a copper-clad laminate with a thin photosensitive film called photoresist. After coating the laminate, it is placed in an exposure unit, where areas of the photoresist can be exposed with light to polymerize that area. Other areas of the laminate which do not receive the light will remain unpolymerized. The next step, commonly known as DES (Develop/Etch/Strip), is where unexposed photoresist will be washed away (Develop), the copper will be etched (Etch), and the remaining exposed photoresist will be washed away (Strip). This leaves a circuit pattern of copper left on the laminate which provides electrical connections for the PCB.

The developer portion of DES will subject the photoresist covered laminate to a caustic solution, typically potassium carbonate. Any unpolymerized photoresist is broken down and rinsed away leaving a polymerized photoresist pattern on the laminate which protects the copper underneath. Upon exiting the developer processing machine, the laminate may be inserted into a copper etching machine wherein exposed copper is etched by a Cupric Chloride or Ammoniacal solution. The copper which is protected by the polymerized photoresist remains unharmed. Upon exiting the etcher processing machine, the laminate is rinsed and transported into a photoresist stripping machine which exposes the laminate to an aggressive base solution. In the photoresist stripping machine, the photoresist's molecular bonds produced during the exposure step are torn apart and rinsed away leaving the copper circuit image on the laminate.

Often times a single machine performs the DES processes. One such machine is a horizontal conveyorized spray line in which laminates are supported by rollers which pass the laminate from roller to roller as they rotate. A laminate which is thick spans across the rollers, even while getting sprayed by solution from sprayers located above and below the rollers. However, thin laminates often cannot span from one roller to the next because they are too flimsy. This results in the front edge of a thin laminate commonly falling between the rollers. Rollers that are closer together will transport a thin laminate, but the presence of the rollers themselves will block the sprayer reducing the likelihood of adequate solution coverage. This results in the circuit image being incorrect. In one example, s-wheels may be added to the conveyor to reduce the amount of blockage of the thin laminate relative to the spray.

PCB process engineers often advise operators to use adhesive tape to fasten a thin laminate to an item commonly referred to as a leader board. The leader board will pull or tow the thin laminate through a conveyor. The leader board does not get caught in the rollers because it is thicker and more rigid. An exemplary leader board is a thicker dielectric. A problem with using the leader board is that the tape must be removed from the thin laminate at the end of the conveyor. This takes time and care because the operator must ensure that the thin laminate is not distorted when the tape is removed. In another example, the thin laminate is taped to a frame member which is thicker than the thin laminate. The thin laminate is typically taped at each of the of four corners. Once again, the tape must be removed at the end of the processing which takes operator time and may distort the thin laminate.

Another step in fabricating printed circuit boards after the circuit pattern is etched on a laminate is surface treatment (commonly called oxide coating). The practice of surface treatment promotes better adhesion between laminates when pressed together to form a PCB. The surface treatment is typically accomplished with a vertical dip tank, but may be accomplished with horizontal conveyor lines, as well. A single dip tank typically holds about 50 gallons of solution. Processes that require a series of solutions will have a line of dip tanks, each tank containing a solution for cleaning, coating, or rinsing the part. An automated hoist system may be employed to move a laminate from tank to tank and to leave the laminate in a given tank a preset amount of time.

The hoist system includes a basket into which multiple laminates are loaded. The laminates must be kept separated during the dipping process. This is not a problem with thick laminates. A problem for thin laminates is that during dipping laminates do not remain flat. Warping of the thin laminate will occur, and the mechanical agitation of the solution will cause waviness for the thin laminate. To counter this, the thin laminate may be taped to a frame made of a thicker dielectric. However, this once again causes additional operator time and potential damage to the thin laminate when the tape is removed. Further, if multiple thin laminates are nearby in the same basket, the thin laminates will tend to stick together by natural fluid adhesion. This disrupts fluid from passing along the surface of the thin laminate and therefore causes the coating of thin laminate to be uneven or inconsistent.

SUMMARY OF THE INVENTION

In an exemplary embodiment of the present disclosure, an apparatus for holding a flexible article is provided. In another exemplary embodiment of the present disclosure, an apparatus for holding a flexible article is provided wherein the flexible article is held between a plurality of frame members. In yet another exemplary embodiment of the present disclosure, an apparatus for holding a flexible article is provided wherein the flexible article is held between a plurality of frame members which are held together through magnets.

In still another exemplary embodiment, an apparatus for holding a flexible article is provided. The apparatus comprising: a first frame member having an outer periphery and an inner periphery, the inner periphery of the first frame member defining a window of the first frame member; a second frame member having an outer periphery and an inner periphery, the inner periphery of the second frame member defining a window of the second frame member, the second frame member being rotatably coupled to the first frame member and movable between an opened position relative to the first frame member and a closed position relative to the first frame member; a first plurality of magnets coupled to the first frame member and spaced around the window of the first frame member; and a second plurality of magnets coupled to the second frame member and spaced around the window of the second frame member, the first plurality of magnets and the second plurality of magnets cooperating to hold the second frame member in the closed position relative to the first frame member.

BRIEF DESCRIPTION OF THE DRAWINGS

The foregoing aspects and many of the attendant advantages of this invention will become more readily appreciated as the same become better understood by reference to the following detailed description when taken in conjunction with the accompanying drawings.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates embodiments of the invention, and such exemplifications are not to be construed as limiting the scope of the invention in any manner.

DETAILED DESCRIPTION OF THE DRAWINGS

For the purposes of promoting an understanding of the principles of the invention, reference will now be made to the embodiments illustrated in the drawings, which are described below. The embodiments disclosed below are not intended to be exhaustive or limit the invention to the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention which would normally occur to one skilled in the art to which the invention relates.

Figure 2:
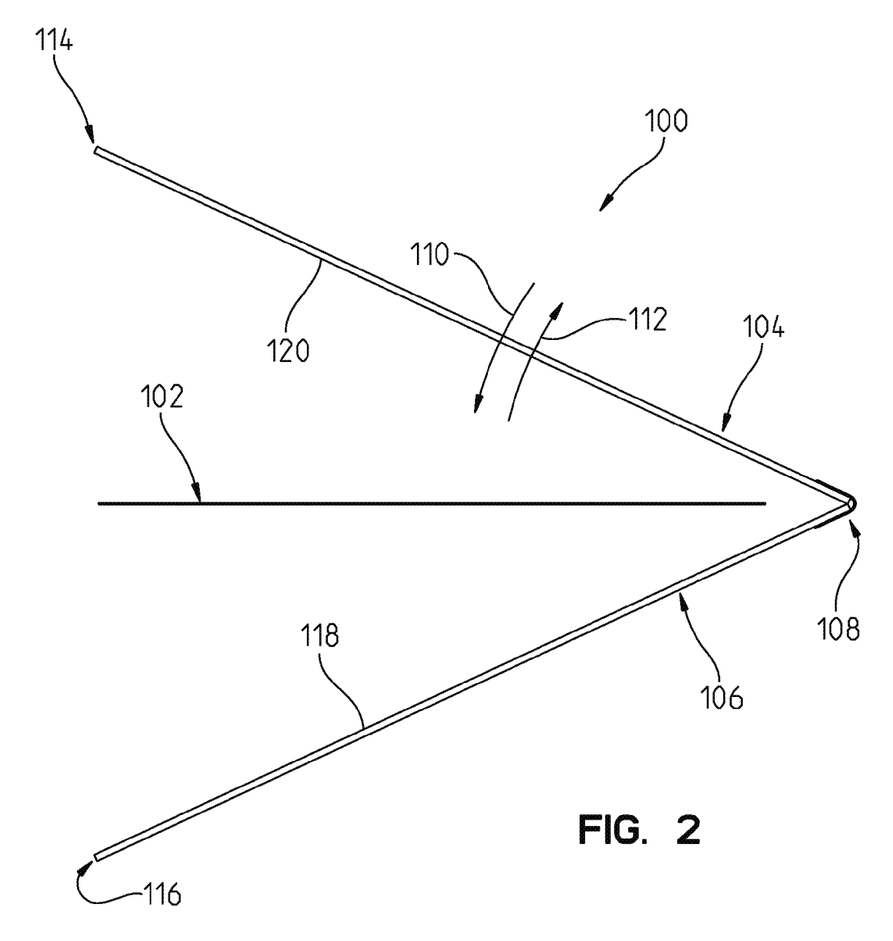
FIG. 2 illustrates a thin laminate being positioned in a holder which holds the thin laminate.

Referring to FIG. 2, a holder 100 for supporting a flexible article 102 is shown. An exemplary flexible article 102 is a thin laminate 10 which is processed to form a layer of PCB 12. As used herein the term thin laminate 10 is defined to be a flexible article having a thickness of up to 125 micrometers. The thin laminate 10 may be used as a portion of a PCB 12. Exemplary thin laminates include a substrate, a dielectric substrate, an integrated circuit substrate, and any other device processed as a portion of a PCB 12. In one embodiment, the thin laminate 10 is at least about 8 micrometers thick. In one embodiment, copper is provided on at least one side of thin laminate 10. In one embodiment, copper is provided on both sides of the thin laminate 10. In one embodiment, the thin laminate 10 is about 18 inches in length by about 12 inches in width. In one embodiment, the thick laminate is about 24 inches in length and about 18 inches in width.

As shown in FIG. 2, holder 100 includes a first frame member 104 and a second frame member 106. First frame member 104 and second frame member 106 are rotatably coupled together. In the illustrated embodiment, first frame member 104 and second frame member 106 are coupled together along their respective top edges with an adhesive tape 108. In alternative embodiments, first frame member 104 and second frame member 106 may be rotatably coupled together through a hinge or other suitable devices for coupling first frame member 104 and second frame member 106.

In one embodiment, the thickness of first frame member 104 and second frame member 106 are selected to provide adequate rigidity to the thin laminate while still being able to pass through the horizontal conveyor system. In one embodiment, first frame member 104 and second frame member 106 are both approximately 0.050 inches thick. In one embodiment, first frame member 104 and second frame member 106 are each at least about 10 times the thickness of flexible article 102. In one embodiment, first frame member 104 and second frame member 106 are each at least about 160 times the thickness of flexible article 102. In one embodiment, first frame member 104 and second frame member 106 are each between about 10 times to about 160 times the thickness of flexible article 102. In one embodiment, first frame member 104 and second frame member 106 are made of epoxy woven glass.

Assuming that an operator is holding second frame member 106 stationary, first frame member 104 may be moved in direction 110 to bring a lower edge 114 of first frame member 104 proximate to a lower edge 116 of second frame member 106. First frame member 104 may be moved in direction 112 to separate lower edge 114 of first frame member 104 from lower edge 116 of second frame member 106.

Figure 3:
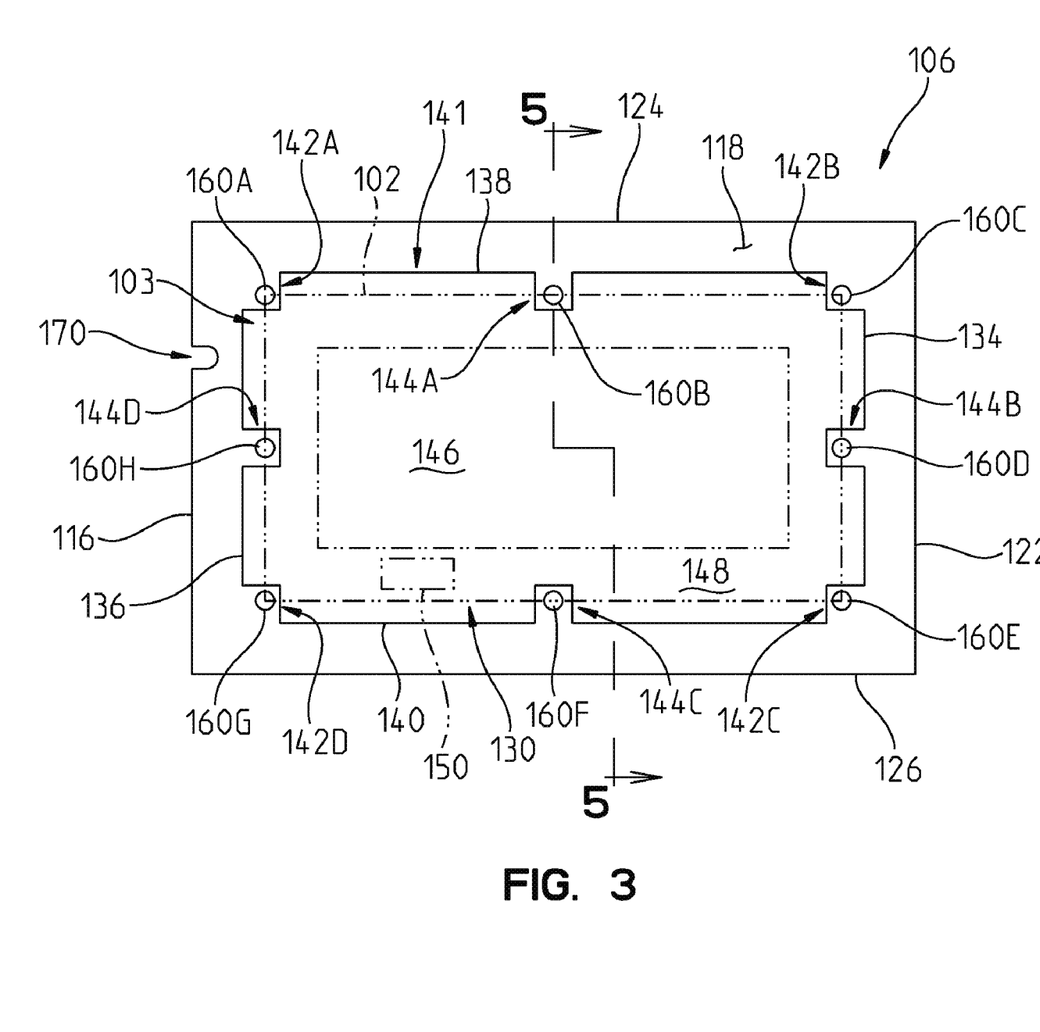
FIG. 3 illustrates the thin laminate of FIG. 2 positioned on top of a lower frame member of the holder of FIG. 2.
Figure 4:
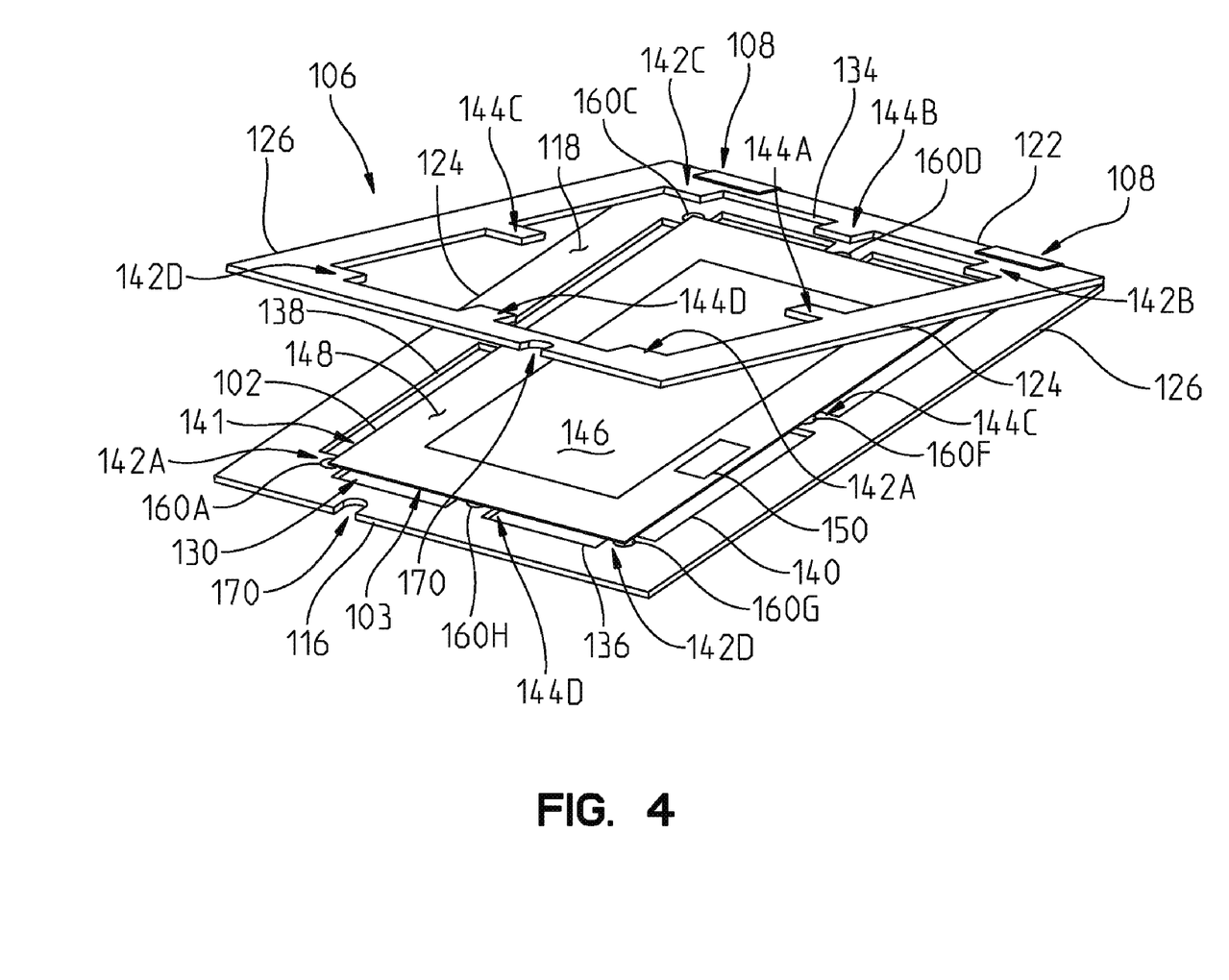
FIG. 4 illustrates a perspective view of the thin laminate of FIG. 2 positioned in the holder of FIG. 2.

Referring to FIG. 3, a top view of second frame member 106 is shown. The layout of second frame member 106 and first frame member 104 are identical. Upper surface 118 of second frame member 106 matches lower surface 120 of first frame member 104. As shown in FIG. 3, second frame member 106 is generally rectangular in shape having a top edge 122, a lower edge 116, a first side edge 124, and a second side edge 126. Although shown as being generally rectangular, second frame member 106 may have any suitable shape.

Figure 5:
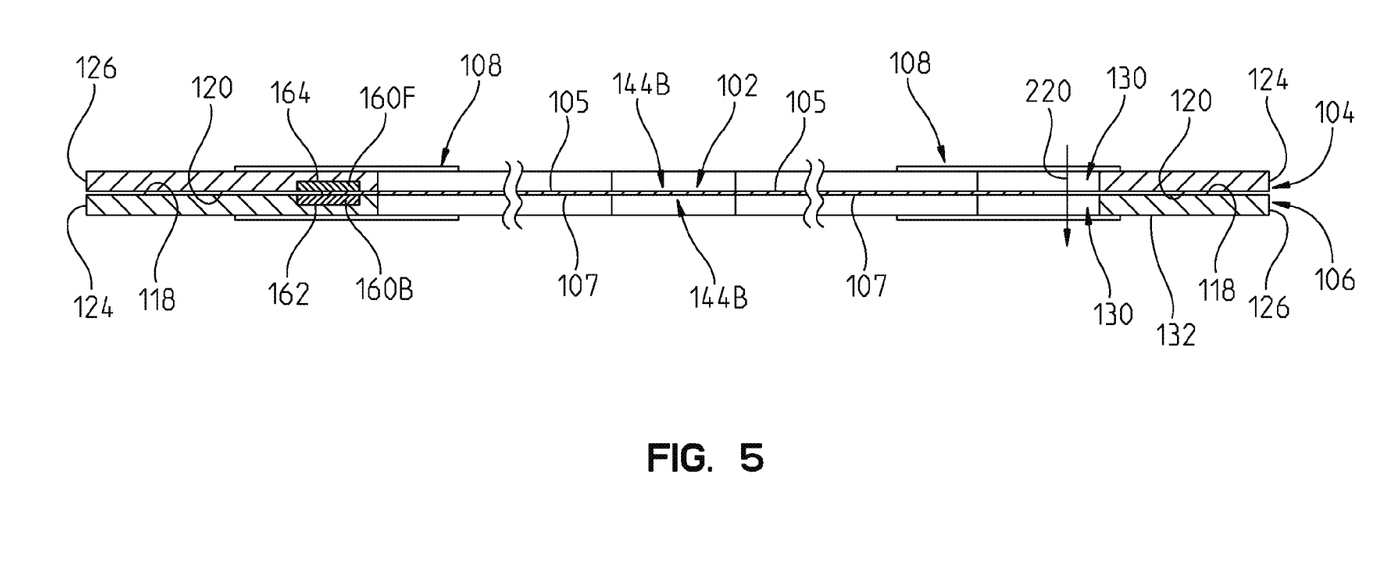
FIG. 5 is a sectional view along lines 5-5 in FIG. 3 through both an upper frame member (not shown in FIG. 3), the thin laminate, and the lower frame member.

Second frame member 106 further includes a window 130. As shown in FIG. 5, window 130 extends completely through second frame member 106 from upper surface 118 to lower surface 132. Window 130 includes a top edge 134, a lower edge 136, a first side edge 138, and a second side edge 140. Top edge 134, lower edge 136, first side edge 138, and second side edge 140 define a portion of a periphery 141 of window 130. Periphery 141 is larger than a periphery 103 of flexible article 102.

Second frame member 106 includes a plurality of corner supports 142A-D which extend inwardly. As shown in FIG. 3, corner supports 142A-D support respective corners of flexible article 102. Second frame member 106 further includes a plurality of side supports 144A-D which extend inwardly. As shown in FIG. 3, side supports 144A-D support respective sides of flexible article 102. A single support 144 is shown for each respective side of window 130. In the illustrated embodiment, each of support 144 is centered between two of supports 142. In one embodiment, more than one supports 144 are provided for at least one of top edge 134, lower edge 136, first side edge 138, and second side edge 140. In one embodiment, supports 142 are replaced with additional supports 144.

In one embodiment, a maximum separation between adjacent supports is about 12 inches (either between one of supports 142 and one of supports 144, or between two of supports 142, or between two of supports 144). In one embodiment, a maximum separation between adjacent supports is about 9 inches (either between one of supports 142 and one of supports 144, or between two of supports 142, or between two of supports 144). In one embodiment, a separation between adjacent supports is up to about 12 inches (either between one of supports 142 and one of supports 144, or between two of supports 142, or between two of supports 144). In one embodiment, a separation between adjacent supports is up to about 9 inches (either between one of supports 142 and one of supports 144, or between two of supports 142, or between two of supports 144).

As shown in FIG. 3, each of supports 142 and supports 144 support an outer portion of flexible article 102. Flexible article 102 is generally divided into two portions, an inner portion 146 and an outer portion 148. Inner portion 146 includes the space of flexible article 102 which is to be processed for use as part of a PCB 12. Outer portion 148 includes one or more coupon regions 150. which provide space for registration coupons and test coupons to be provided on flexible article 102. Generally in the manufacture of PCB 12, outer portion 148 is removed during processing.

First frame member 104 and second frame member 106 further include a plurality of magnets 160. Illustratively eight magnets 160A-H are shown for second frame member 106. First frame member 104 also includes eight magnets 160A-H. In one embodiment, one of first frame member 104 and second frame member 106 includes a plurality of magnets 160 while the other of first frame member 104 and second frame member 106 is made of a ferromagnetic material. Exemplary ferromagnetic materials include iron, steel, stainless steel, or other suitable materials which magnetically couple with magnets 160.

Referring to FIG. 5, flexible article 102 is sandwiched between magnet 160B of second frame member 106 and magnet 160F of first frame member 104. Each of magnets 160, illustratively magnet 160B and magnet 160F, are received in a respective recess 162 of second frame member 106 and recess 164 of first frame member 104 such magnet 160B and magnet 160F, are generally flush with upper surface 118 of second frame member 106 and lower surface 120 of first frame member 104, respectively. The magnets 160 of first frame member 104 and second frame member 106 are held in their respective recesses with an adhesive or other coupling mechanism. In one embodiment, magnets 160 are about 0.5 inches in diameter and have a thickness of about 0.063 inches. In one embodiment, a conformal coating is applied over each magnet 160 and the adjacent portion of the frame to prevent the chemicals used during the processing of flexible article from attacking the magnet. An exemplary conformal coating is a polyurethane coating.

Referring to FIG. 5, magnet 160B of second frame member 106 is attracted to magnet 160F of first frame member 104. The same is the case for the remainder of the magnets of first frame member 104 and second frame member 106. As such, when first frame member 104 is rotated in direction 110, first frame member 104 is held proximate to second frame member 106 due to the attraction of magnets 160. Further, magnets 160 hold flexible article 102 in place between first frame member 104 and second frame member 106. In one embodiment, the strength of magnets 160 is at least about 2.7 pounds. In one embodiment, the strength of magnets 160 is about 2.7 pounds. In one embodiment, magnets 160 are permanent magnets. An exemplary permanent magnet is made from an alloy of Neodymium, Iron and Boron. Other types of magnets may be used such as electromagnets, strip magnets, or other types of magnetic devices.

To aid in the separation of first frame member 104 from second frame member 106, both first frame member 104 and second frame member 106 include a thumb slot 170, respectively, which permits an operator to push on the other of first frame member 104 and second frame member 106. Thumb slots 170 give each of first frame member 104 and second frame member 106 a different outside periphery.

Figure 6:
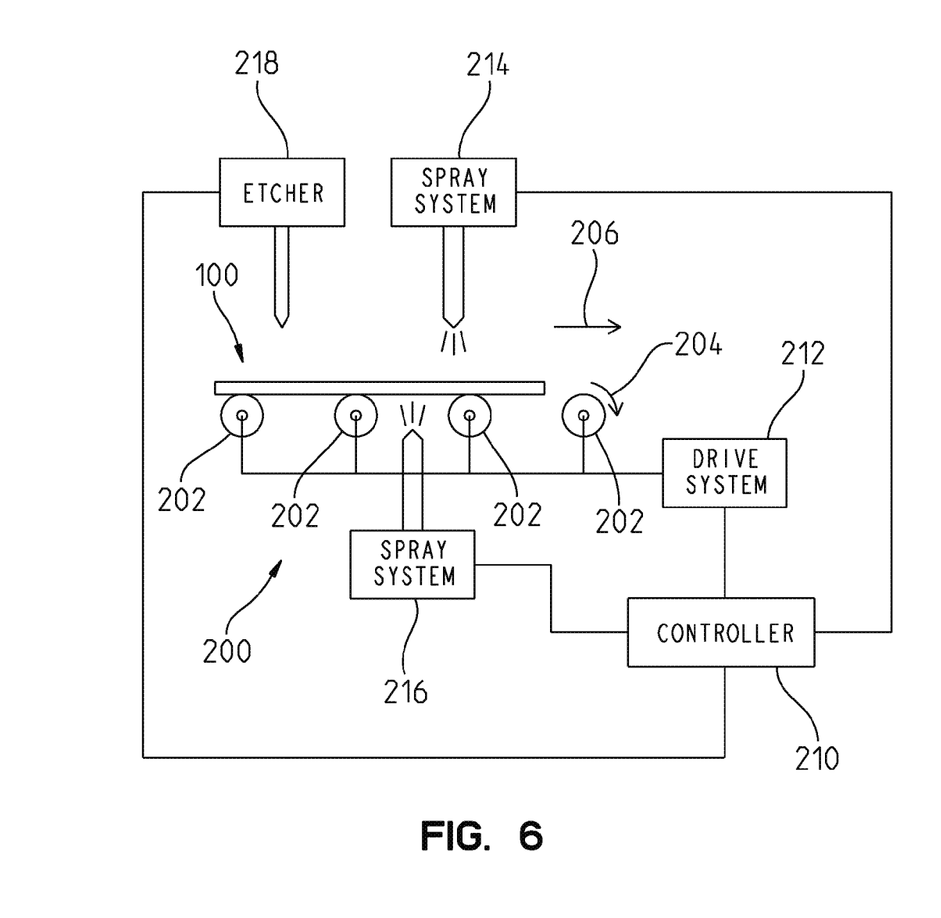
FIG. 6 illustrates the holder of FIG. 2 with a thin laminate being transported through an exemplary horizontal conveyor system.

Referring to FIG. 6, holder 100 (holding a flexible article 102) is shown as it travels through a representative horizontal conveyor system 200. Horizontal conveyor system 200 includes a plurality of rollers 202 which support holder 100 and which rotate in direction 204 to transport holder 100 in direction 206. Rollers 202 are arranged in rows which extend back in the page to support holder 100 along its width. Holder 100 prevents flexible article 102 from contacting rollers 202 thereby preventing rollers 202 from making any impressions on flexible article 102.

The rotational speed of rollers 202 is controlled with a controller 210 which drives a drive system 212. An exemplary drive system includes a motor and a linkage connecting the motor to the rows of rollers. Exemplary linkages include a chain and sprockets.

Controller 210 also controls one or more of upper spray systems 214 and one or more lower spray systems 216. Upper spray systems 214 sprays fluid down on holder 100 from above rollers 202. Lower spray systems 216 sprays fluid up on holder 100 from below rollers 202. Controller 210 may also control other types of devices in addition to upper spray systems 214 and lower spray systems 216, such as etcher 218. An exemplary controller is a microprocessor programmed to control the operation of upper spray systems 214, lower spray systems 216, and etcher 218 while also controlling the speed of rollers 202. Although an exemplary horizontal conveyor system 200 is shown, holder 100 may work to support flexible article 102 through any type of processing sequence.

Holder 100 provides a rigid holder for flexible article 102 and prevents flexible article 102 from falling between rollers 202. Further, holder 100 allows a spacing of rollers 202 to be increased. Referring to FIGS. 3 and 5, holder 100 by having an inner periphery 141 larger than the periphery 103 of flexible article 102, allows fluid 220 to migrate from an upper surface 105 of flexible article 102 to below a lower surface 107 of flexible article 102.

Figure 7:
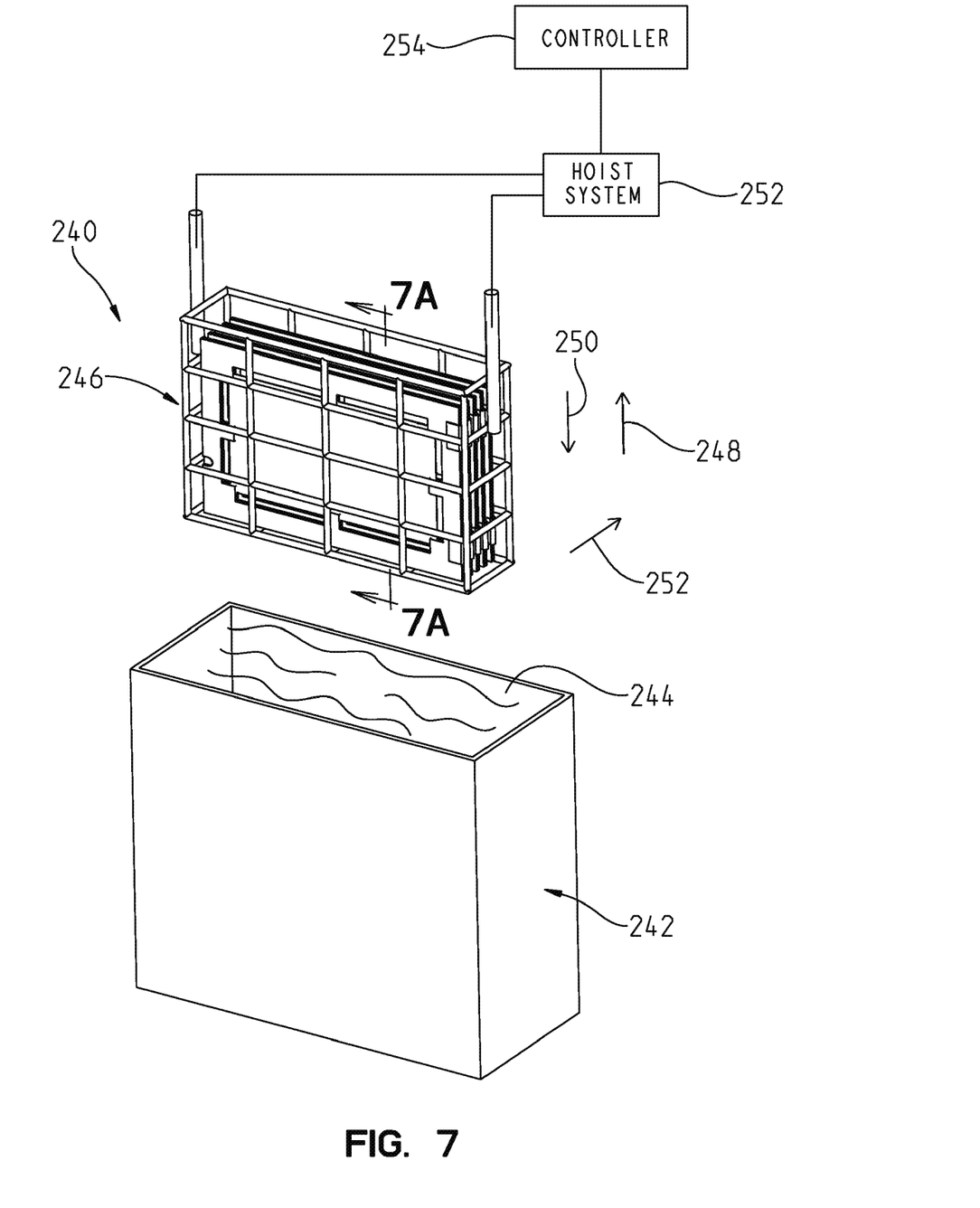
FIG. 7 illustrates the holder of FIG. 2 with a thin laminate being transported through an exemplary vertical dip system.

Referring to FIG. 7, holder 100 may also be used to support flexible article 102 when flexible article 102 is being processed in a vertical dip tank system 240. Vertical dip tank system 240 includes a tank 242 containing a solution 244. A basket 246 is provided which holds one or more holders 100 in a vertical fashion. Basket 246 permits solution 244 to enter an interior of basket 246 to contact flexible articles 102 and permits solution 244 to exit the interior of basket 246.

Basket 246 is raised in direction 248 and lowered in direction 250 by a hoist system 252. Hoist system 252 also transports basket 246 in direction 252 to present the flexible articles 102 in basket 246 to another tank 242 or to an unloading station. Hoist system 252 is controlled by a controller 254. An exemplary controller is a microprocessor programmed to control the operation of hoist system 252 to move basket 246 in directions 248, 250, and 252. Further, controller 254 controls an amount of time that basket 246 and hence flexible articles 102 are immersed in solution 244.

Figure 7A:
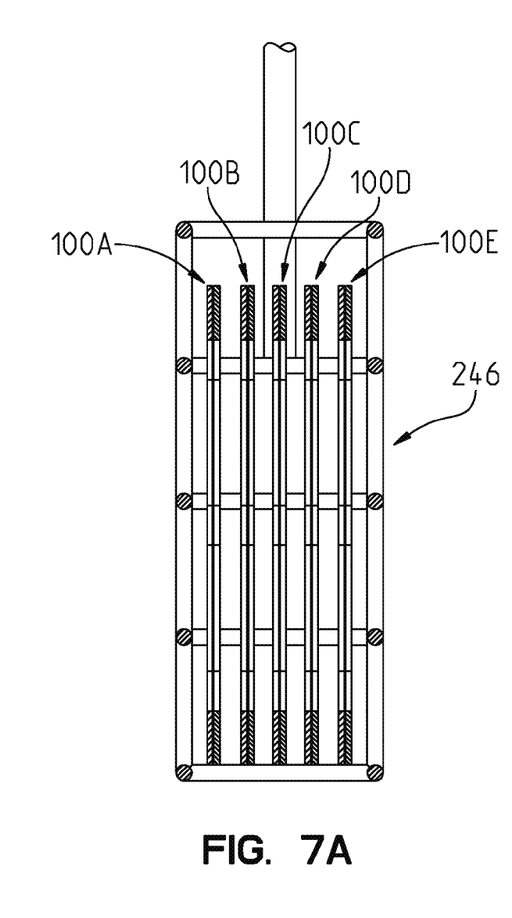
FIG. 7A is a sectional view along lines 7A-7A in FIG. 7.

Referring to FIG. 7A, multiple holders 100 may be positioned in basket 246 at the same time. Each of holders 100 are shown being generally vertically disposed. In one embodiment, basket 246 includes individual cradles for holding each of holder 100 generally vertical. However, since flexible article 102 is not flush with an outer surface of holder 100, holder 100 may be tilted to rest on the side of basket 246 without the flexible article 102 of holder 100 contacting adjacent flexible articles 102. Further, holder 100 sandwiches flexible article 102 and prevents flexible article 102 from being manipulated by fluid currents in tank 242.

Figure 8:
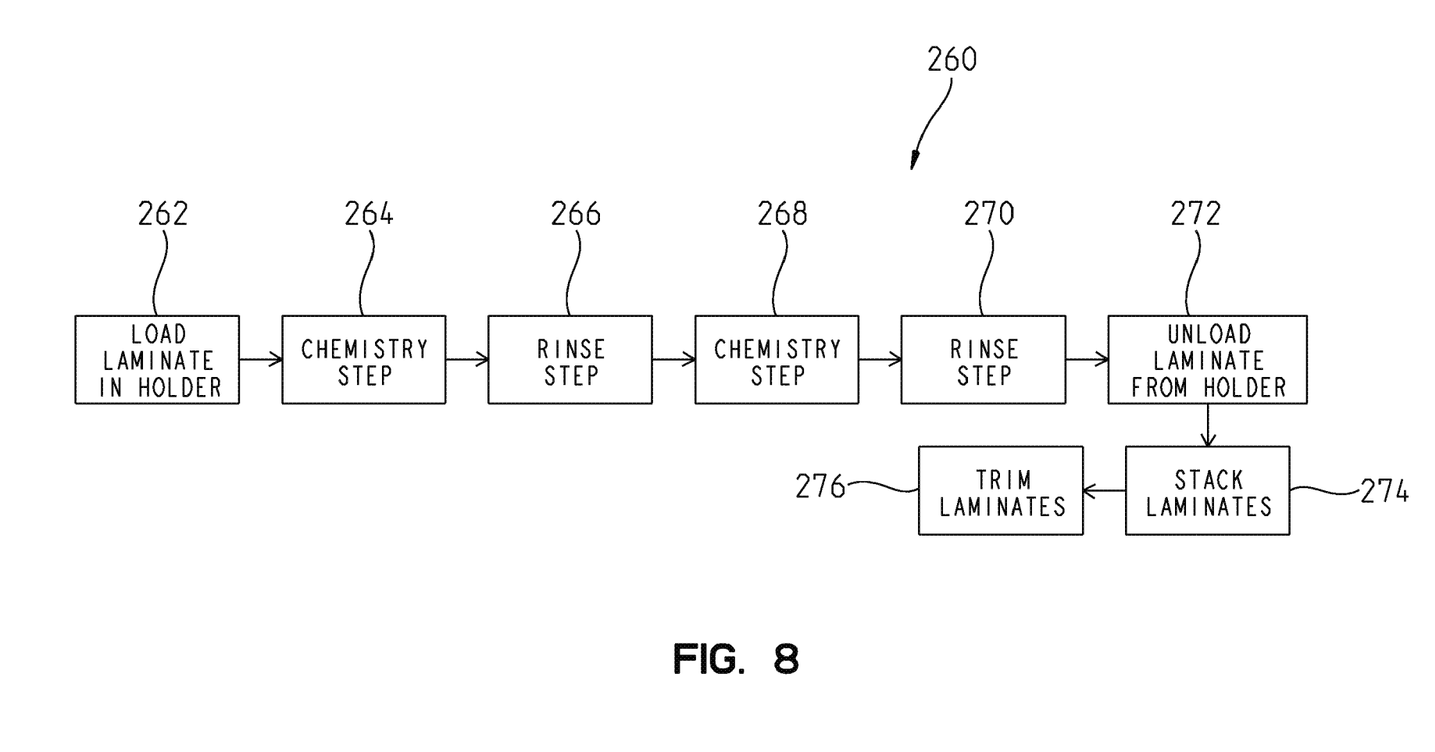
FIG. 8 is a representative processing sequence of using the holder of FIG. 2 in the manufacture of a printed circuit board.

Referring to FIG. 8, an exemplary process 260 is shown. Flexible article 102 is loaded into holder 100, as represented by block 262. The loading of flexible article 102 into holder 100 may be accomplished as follows. An operator places holder 100 on a flat surface, second frame member 106 resting the flat surface. The operator separates first frame member 104 from second frame member 106, thereby disengaging all of magnets 160. The operator then transports flexible article 102 on top of second frame member 106, ensuring the magnets 160 (or standoff 290 as explained herein) will sandwich flexible article 102 once first frame member 104 is brought to rest on second frame member 106. The operator brings first frame member 104 to rest on second frame member 106. At this point holder 100 may be lifted off of the flat surface.

Returning to FIG. 8, flexible article 102 is then passed through a plurality of chemistry steps and rinse steps, as represented by blocks 264-270. The plurality of chemistry steps and rinse steps may be performed through a conveyorized spray line (such as represented in FIG. 6), a series of dip tanks full of solution (as represented in FIG. 7) or combination thereof. In one embodiment, the hinged end of holder 100 is loaded first into a conveyorized spray line to reduce the likelihood that first frame member 104 will become separated from second frame member 106 as holder 100 passes through the conveyorized spray line. Holder 100 also keeps the respective flexible article 102 separated, if the holders 100 are stacked to transport a plurality of flexible articles 102 from one conveyorized system or dip system to another conveyorized system or dip system.

Flexible article 102 is unloaded from holder 100, as represented by block 272. Holder 100 does not physically adhere to flexible article 102 like an adhesive would. As such, when first frame member 104 is rotated away from second frame member 106 the operator may easily remove a clean flexible article 102 from holder 100. A plurality of flexible articles 102 are stacked together and pressed, as represented by block 274. The outer region of flexible article 102 is trimmed, as represented by block 276.

The chemistry steps 264 and 268 may be any suitable processing steps for altering the flexible article, such as a developer step, an etcher step, a stripper step, or any other suitable steps.

Figure 9:
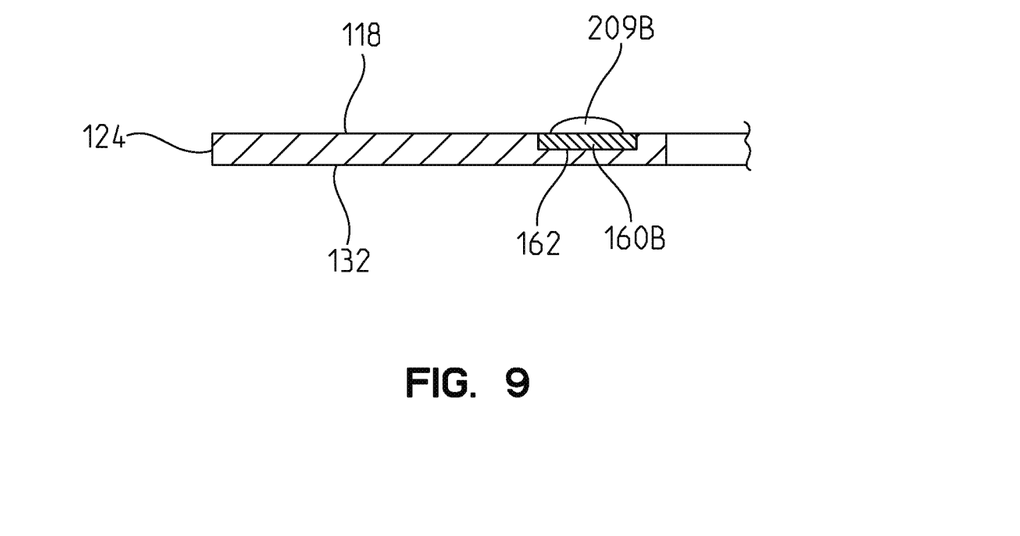
FIG. 9 illustrates a standoff added to the lower frame member of the holder of FIG. 2.

Referring to FIG. 9, in one embodiment, a standoff 290 is provided on top of magnets 160. In one embodiment, standoff 290 is made of silicone. In one embodiment, standoff 290 is made of rubber. In one embodiment, standoff 290, in an uncompressed state as shown in FIG. 9, has a height of about 0.125 inches. Each of magnet 160A-H has an associated standoff 290.

Figure 10:
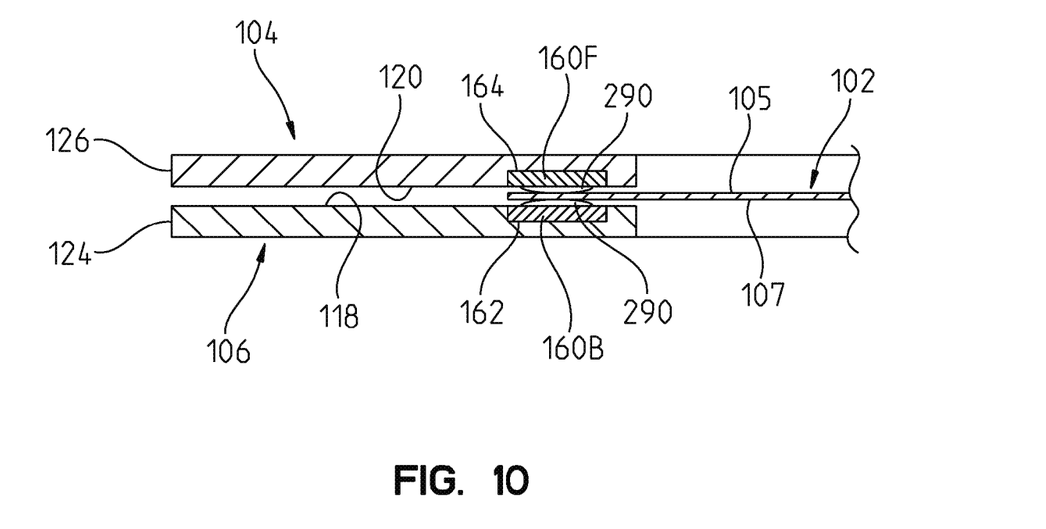
FIG. 10 illustrates a portion of the sectional view of FIG. 5 including the standoffs of FIG. 9.

Referring to FIG. 10, flexible article 102 is shown sandwiched between first frame member 104 and second frame member 106 when first frame member 104 and second frame member 106 both include standoffs 290. As shown in FIG. 10 when compared to FIG. 5, standoffs 290 provide a gap between lower surface 120 of first frame member 104 and upper surface 105 of flexible article 102 and a gap between upper surface 118 of second frame member 106 and lower surface 107 of flexible article 102. These gaps facilitate in the draining of fluid from between first frame member 104 and second frame member 106.

Figure 11:
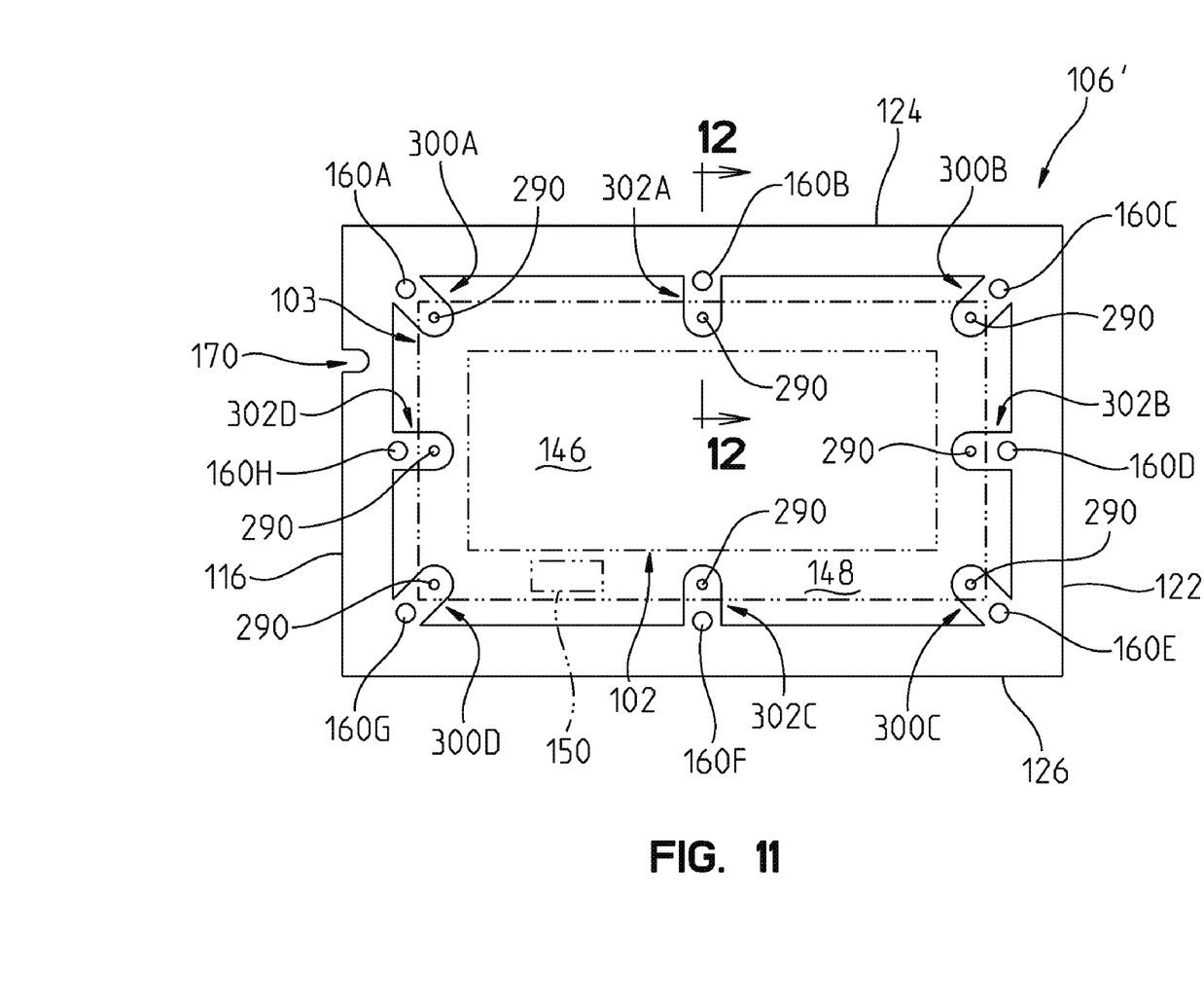
FIG. 11 illustrates a top view of a lower frame member having supports which include standoffs spaced apart from magnets.
Figure 12:
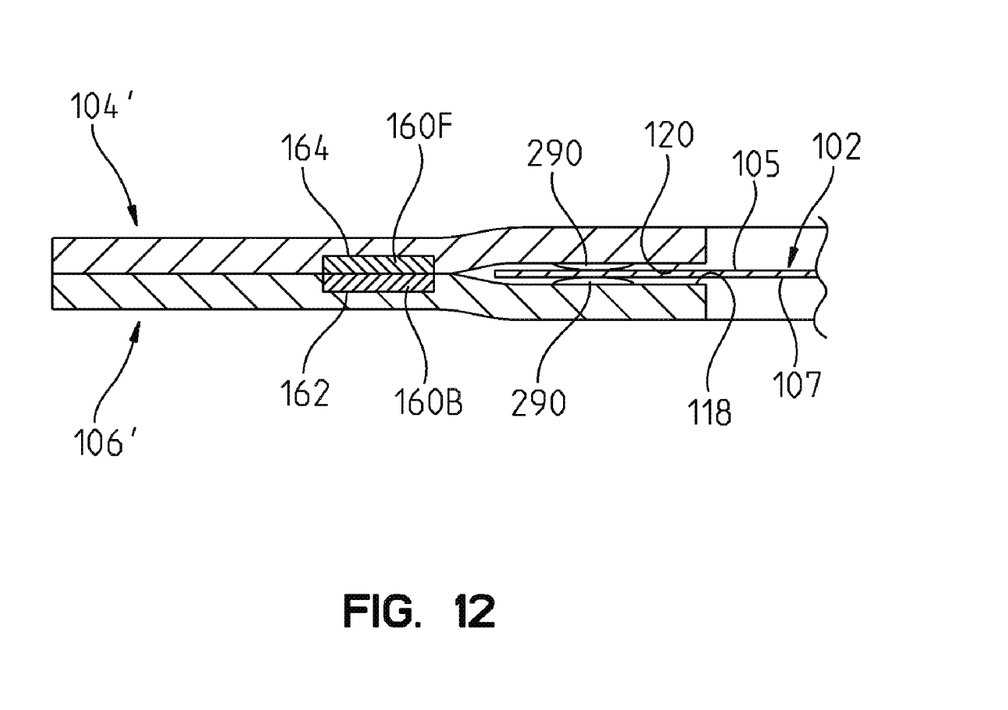
FIG. 12 is a sectional view along lines 12-12 in FIG. 11 through both an upper frame member (not shown in FIG. 11), the thin laminate, and the lower frame member.

Referring to FIG. 11, another version of second frame member 106' is shown. A second version of first frame member 104' is also provided. First frame member 104' is identical to second frame member 106'. Second frame member 106' includes a plurality of corner supports 300A-D which extend inward. As shown in FIG. 11, corner supports 300A-D support respective corners of flexible article 102 on standoff 290. Second frame member 106 further includes a plurality of side supports 302A-D which extend inward. As shown in FIG. 11, side supports 302A-D support respective sides of flexible article 102 on standoffs 290. A single support 302 is shown for each respective side of window 130. In the illustrated embodiment, each of supports 302 are centered between two of supports 300. In one embodiment, more than one support 302 is provided for at least one of top edge 134, lower edge 136, first side edge 138, and second side edge 140. In one embodiment, supports 300 are replaced with additional supports 302.

In one embodiment, a maximum separation between adjacent supports is about 12 inches (either between one of supports 300 and one of supports 302, or between two of supports 300, or between two of supports 302). In one embodiment, a maximum separation between adjacent supports is about 9 inches (either between one of supports 300 and one of supports 302, or between two of supports 300, or between two of supports 302). In one embodiment, a separation between adjacent supports is up to about 12 inches (either between one of supports 300 and one of supports 302, or between two of supports 300, or between two of supports 302). In one embodiment, a separation between adjacent supports is up to about 9 inches (either between one of supports 300 and one of supports 302, or between two of supports 300, or between two of supports 302).

In one embodiment, the width of supports 300 and supports 302 are about twice the diameter of magnets 160. In one embodiment, magnets 160 are about 0.5 inches in diameter and about 0.063 inches in thickness. In one embodiment, each of standoffs 290 are at least about 0.375 inches from an edge of the respective supports 300 and supports 302. In one embodiment, each of standoffs 290 are at least about 0.5 inches from an edge of the respective supports 300 and supports 302.

In one embodiment, magnets 160 are positioned as shown in FIG. 11, at the intersection of the main body of second frame member 106 and the respective supports 300 or supports 302. In one embodiment, magnets 160 may be contained solely in the body portion of second frame member 106. In one embodiment, magnets 160 may be contained solely in supports 300 or supports 302 of second frame member.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

The invention claimed is:

1. A method of transporting a flexible article, the method comprising the steps of:
supporting the flexible article on a first frame member which supports a portion of a periphery of the flexible article at a first side of each corner of said flexible article and a plurality of sections of said first side of said flexible article, each said plurality of sections is between different sets of said corners of said flexible article, wherein said flexible article further comprises an inner section formed within said periphery, said inner section is a section of said flexible article which is to be subjected to processing for use as part of a printed circuit structure and said periphery is to be removed from said flexible article after said processing;
rotatably placing a second frame member relative to the first frame member so that the flexible article is positioned between the first frame member and the second frame member, wherein said second frame is in contact with said flexible article at a second side of each said corner of said flexible article and said plurality of sections of said second side of said flexible article;
magnetically holding the second frame member relative to the first frame member by a plurality of magnetic sections formed in recesses in said first and second frames at each of said corners and each of said plurality of sections, wherein each of said magnetic sections are substantially flush with an adjacent section of said first or second frame where each of said magnetic sections are disposed within a respective one of said recesses, the first frame member having a window to permit access to said first side of the flexible article and the second frame member having a window to permit access to said second side of the flexible article; and
coupling at least one edge of said first and second frame members together to prevent said first and second frame members from moving relative to each other using a releasably coupling structure.

2. The method of claim 1, wherein said plurality of magnetic sections are formed with a plurality of magnets in one of the first frame member and the second frame member, and the other of the first frame member and the second frame member is made of a ferromagnetic material.

3. The method of claim 1, wherein the first frame member includes a plurality of compressible standoffs formed on said plurality of magnetic sections and the step of supporting the flexible article on the first frame member includes placing the flexible article on top of the compressible standoffs.

4. The method of claim 3, wherein the second frame member includes a plurality of compressible standoffs, the flexible article being held between the plurality of compressible standoffs of the first frame member and the plurality of standoffs of the second frame member during the step of magnetically holding the second frame member relative to the first frame member.

5. The method of claim 1, wherein the first frame member includes a plurality of supports at each of said corners and said plurality of sections extending inwardly and the second frame member includes a plurality of supports extending inwardly and the step of supporting the flexible article on the first frame member includes placing the flexible article on top of the plurality of supports of the first frame member, wherein each one of said recesses are formed in a respective one of each of said plurality of supports, each one of said plurality of magnetic sections are disposed within respective each of said recesses.

6. The method of claim 5, wherein the flexible article is held between the plurality of supports of the first frame member and the plurality of supports of the second frame member during the step of magnetically holding the second frame member relative to the first frame member.

7. A method of transporting a thin laminate through a conveyor system to process the thin laminate as a part of a printed circuit board, the method comprising the steps of:
installing the thin laminate in a rigid holder comprising a first frame member and a second frame member, said step of installing comprising:
supporting the thin laminate on said first frame member which supports a portion of a periphery of the thin laminate at a first side of each corner of said thin laminate and a plurality of sections of said first side of said thin laminate, each said plurality of sections is between different sets of said corners of said thin laminate, wherein said thin laminate further comprises an inner section formed within said periphery, said inner section is a section of said thin laminate which is to be subjected to processing for use as part of a printed circuit structure and said periphery is to be later removed from said thin laminate after said processing;
rotatably placing said second frame member relative to the first frame member so that the thin laminate is positioned between the first frame member and the second frame member, wherein said second frame is in contact with said thin laminate at a second side of each said corner of said thin laminate and said plurality of sections of said second side of said thin laminate;
magnetically holding the second frame member relative to the first frame member by a plurality of magnetic sections formed in recesses in said first and second frames at each of said corners and each of said plurality of sections, wherein each of said magnetic sections are substantially flush with an adjacent section of said first or second frame where each of said magnetic sections are disposed within a respective one of said recesses, the first frame member having a window to permit access to said first side of the thin laminate and the second frame member having a window to permit access to said second side of said thin laminate; and coupling at least one edge of said first and second frame members together to prevent said first and second frame members from moving relative to each other using a releasable coupling structure;

placing the rigid holder on the conveyor of the conveyor system;

advancing the rigid holder through the conveyor system to expose the thin laminate to at least one chemistry treatment;

removing the rigid holder from the conveyor of the conveyor system; and separating the thin laminate from the rigid holder.

8. The method of claim 7, wherein the step of magnetically holding the second frame member relative to the first frame member includes the step of:

coating said plurality of magnetic sections with a material which is resistant to fluids used in said processing and the coating contacts the thin laminate.

9. The method of claim 7, wherein the step of rotatably placing said second frame member relative to the first frame member includes the steps of:

placing the thin laminate between said first frame member and said second frame member, the first frame member being rotatably coupled to the second frame member along a first edge.

10. The method of claim 9, wherein the first edge is the leading edge of the rigid holder as the rigid holder is advanced through the conveyor system.

11. The method of claim 7, wherein the step of advancing the rigid holder through the conveyor system to expose the thin laminate to said processing which comprises at least one chemistry treatment includes the steps of:

advancing the rigid holder in a generally horizontal direction; and spraying a chemical treatment on the thin laminate from a generally vertical direction.

12. The method of claim 7, wherein the step of advancing the rigid holder through the conveyor system to expose the thin laminate to said processing which comprises at least one chemistry treatment includes the steps of:

advancing the rigid holder in a generally vertical direction; and spraying a chemical treatment on the thin laminate from a generally horizontal direction.

13. A method of transporting a thin laminate through a vertical dip system to process the thin laminate as a part of a printed circuit board, the method comprising the steps of:

installing the thin laminate in a rigid holder comprising a first frame member and a second frame member, said step of installing comprising:

supporting the thin laminate on said first frame member which supports a portion of a periphery of the thin laminate at a first side of each corner of said thin laminate and a plurality of sections of said first side of said thin laminate, each said plurality of sections is between different sets of said corners of said thin laminate, wherein said thin laminate further comprises an inner section formed within said periphery, said inner section is a section of said thin laminate which is to be subjected to processing for use as part of a printed circuit structure and said periphery is to be later removed from said thin laminate after said processing;

rotatably placing said second frame member relative to the first frame member so that the thin laminate is positioned between the first frame member and the second frame member, wherein said second frame is in contact with said thin laminate at a second side of each said corner of said thin laminate and said plurality of sections of said second side of said thin laminate;

magnetically holding the second frame member relative to the first frame member by a plurality of magnetic sections formed in recesses in said first and second frames at each of said corners and each of said plurality of sections, wherein each of said magnetic sections are substantially flush with an adjacent section of said first or second frame where each of said magnetic sections are disposed within a respective one of said recesses, the first frame member having a window to permit access to said first side of the thin laminate and the second frame member having a window to permit access to said second side of said thin laminate; and coupling at least one edge of said first and second frame members together to prevent said first and second frame members from moving relative to each other using a releasably coupling structure;

placing the rigid holder in a basket of the vertical dip system along with at least one additional rigid holder holding another thin laminate, the rigid holder and the at least one additional rigid holder keeping the thin laminate and the another thin laminate spaced apart;

positioning the rigid holder in a tank of the vertical dip system to expose the thin laminate to at least one chemistry treatment;

removing the rigid holder from the basket of the vertical dip system; and separating the thin laminate from the rigid holder.

14. The method of claim 13, wherein the step of magnetically holding the second frame member relative to the first frame member includes the step of:

coating said plurality of magnetic sections with a material which is resistant to fluids used in said processing and the coating contacts the thin laminate.

15. The method of claim 7, wherein the first frame member includes a plurality of compressible standoffs formed on said plurality of magnetic sections and the step of supporting the thin laminate on the first frame member includes placing the thin laminate on top of the compressible standoffs.

16. The method of claim 15, wherein the second frame member includes a plurality of said compressible standoffs, the thin laminate being held between the plurality of compressible standoffs of the first frame member and the plurality of standoffs of the second frame member during the step of magnetically holding the second frame member relative to the first frame member.

17. The method of claim 7, wherein the first frame member includes a plurality of supports at each of said corners and said plurality of sections extending inwardly and the second frame member includes a plurality of supports extending inwardly and the step of supporting the thin laminate on the first frame member includes placing the thin laminate on top of the plurality of supports of the first frame member, wherein each one of said recesses are formed in a respective one of each of said plurality of supports, each one of said plurality of magnetic sections are disposed within respective each of said recesses.

18. The method of claim 17, wherein the thin laminate is held between the plurality of supports of the first frame member and the plurality of supports of the second frame member during the step of magnetically holding the second frame member relative to the first frame member.

19. The method of claim 13, wherein the first frame member includes a plurality of compressible standoffs formed on said plurality of magnetic sections and the step of supporting the thin laminate on the first frame member includes placing the thin laminate on top of the compressible standoffs.

20. The method of claim 19, wherein the second frame member includes a plurality of said compressible standoffs, the thin laminate being held between the plurality of compressible standoffs of the first frame member and the plurality of standoffs of the second frame member during the step of magnetically holding the second frame member relative to the first frame member.

21. The method of claim 13, wherein the first frame member includes a plurality of supports at each of said corners and said plurality of sections extending inwardly and the second frame member includes a plurality of supports extending inwardly and the step of supporting the thin laminate on the first frame member includes placing the thin laminate on top of the plurality of supports of the first frame member, wherein each one of said recesses are formed in a respective one of each of said plurality of supports, each one of said plurality of magnetic sections are disposed within respective each of said recesses.

22. The method of claim 21, wherein the thin laminate is held between the plurality of supports of the first frame member and the plurality of supports of the second frame member during the step of magnetically holding the second frame member relative to the first frame member.

23. The method of claim 1, wherein said first frame member further comprises a thumb slot comprising a cutout formed in an outer periphery of said first frame member on one side of said frame member, said thumb slot is adapted to permit an operator to push on said second frame and rotatably move said first and second frame members apart in order to remove said flexible article from said first and second frame.

24. The method of claim 3, wherein said compressible standoffs are formed with silicone.

25. The method of claim 1, wherein said first and second frame members are rotatably coupled on one side by a hinge which is adapted to rotatably couple said first and second frame members on said one side.

* * * * *